United States Patent [19]

Kim

[11] Patent Number: 5,748,652
[45] Date of Patent: May 5, 1998

[54] APPARATUS FOR DETECTING AND CORRECTING CYCLIC REDUNDANCY CHECK ERRORS

[75] Inventor: Jin-Tae Kim, Ichon-kun, Rep. of Korea

[73] Assignee: Hyundai Electronics Ind. Co., Ltd., Kyounggi-do, Rep. of Korea

[21] Appl. No.: 664,002

[22] Filed: Jun. 14, 1996

[30] Foreign Application Priority Data

Jun. 29, 1995 [KR] Rep. of Korea ............... 18247/1995

[51] Int. Cl.$^6$ ............... G06F 11/10; H03M 13/00
[52] U.S. Cl. ............... 371/53; 371/37.7; 371/67.1
[58] Field of Search ............... 371/53, 30, 37.6, 371/37.7, 67.1, 68.1

[56] References Cited

U.S. PATENT DOCUMENTS

| | | | |
|---|---|---|---|
| 4,679,082 | 7/1987 | Shibasaki | 358/147 |
| 4,785,468 | 11/1988 | Yoshida | 375/75 |
| 5,251,215 | 10/1993 | Dravida et al. | 370/94.1 |
| 5,473,615 | 12/1995 | Boyer et al. | 371/5.1 |

FOREIGN PATENT DOCUMENTS 2303029   6/1995   United Kingdom.

Primary Examiner—Phung Chung
Attorney, Agent, or Firm—Whitham, Curtis, Whitham & McGinn

[57] ABSTRACT

A cyclic redundancy check (CRC) circuit for detecting and correcting errors in a data stream uses a decoder and a serial-to-parallel buffer to shorten arithmetic operation time. The CRC circuit includes a first gate for switching a serial input data stream into a syndrome register section, and a buffer register for converting the serial input data to a parallel data. The syndrome register section forms redundancies for input data stream. An OR gate receives data from the syndrome register section to enable a decoder if the syndrome register section detects an error in the data stream. The decoder decodes the output from the syndrome register section. The output of the decoder is exclusively-ORed with the input data in the parallel shift register. A latch circuit thereafter outputs a corrected serial data stream.

9 Claims, 2 Drawing Sheets

APPARATUS FOR DETECTING AND CORRECTING CYCLIC REDUNDANCY CHECK ERRORS

BACKGROUND OF THE INVENTION

1. Field of the Invention

The present invention relates to an apparatus for detecting and correcting cyclic redundancy check (CRC) errors, in which a decoder and parallel shift registers are used, thereby shortening the arithmetic operation time.

2. Description of the Prior Art

In data communications and wireless communications, the original signals cannot be transmitted and received without correcting errors. As described in U.S. Pat. No. 5,251,215, CRC (cyclic redundancy check) is a code which is used in detecting or correcting the errors which occur during transmission and receiving.

The CRC processing is carried out by shift registers of different portions. An output of a shift register is inputted into an EX-OR gate, and its output is fedback into another Ex-OR gate which is disposed between other shift registers.

Such a CRC apparatus is divided into a system having a cyclic structure, and a system having a parallel structure.

In the system having a cyclic structure, the original data pass from the transmitting terminal through a CRC encoder so as to be combined with CRC data (original data+CRC data). At the receiving end, the combined data pass through a CRC decoder consisting of shift registers and Ex-OR gates, with the result that a syndrome is formed. If the value of the syndrome is "0", it is meant that there is no error in the data, while if the value of the syndrome is "1", it is meant that there are errors in the data.

The extraction of the syndrome is realized by logic-multiplying the outputs of the shift registers by utilizing AND gates. However, the method in which the AND gates are used is accompanied by a disadvantage that much time is required in detecting the errors.

FIG. 1 illustrates the conventional CRC decoder.

A multiplexer 4 selectively outputs an input data (code word r(x)=message+parity) to a buffer register 5. If the data are inputted into the buffer register 5, the multiplexer 4 does not supply the data during the time when the buffer register 5 shifts the data to the right. Under this condition, the output of the buffer register 5 and the syndrome output of a third gate 3 are inputted into an Ex-OR gate 6 to undergo an arithmetic operation. Then the output is fedback through the multiplexer 4 to the buffer register 5 to correct the errors, and thus, the data with errors corrected (r'(x)) are left in the buffer register 5.

A first gate 1 is turned off when the data are inputted into the buffer register 5, while it is turned on when the next receiving vector r1 begins to be inputted. A second gate 2 and the third gate 3 switch-control the data which are inputted into a syndrome register section 10 and an AND gate G1.

In the conventional apparatus for detecting and correcting the CRC errors as described above, there are used AND gates, and therefore, much time is consumed in detecting the errors. Therefore, in the case where data are transmitted and received in large amounts, it is difficult to correct errors, and therefore, it has to be renounced only by detecting the errors (Refer to "Error Control Coding" by Shulin/J. and Costello Jr.).

That is, immediately after the data are inputted into the buffer register, the first gate is turned off, and then, the syndrome register is shifted as much as the number of the buffer registers, thereby correcting the errors. In this method, only after the data are inputted into the buffer register, the syndrome register is shifted as much as the number of the buffer registers, and therefore, so much longer time is required.

SUMMARY OF THE INVENTION

The present invention is intended to overcome the above described disadvantage of the conventional technique.

Therefore it is the object of the present invention to provide an apparatus for detecting and correcting CRC errors, in which the time for detecting and correcting the CRC errors is shortened, and the CRC error detection is carried out in a simple manner.

In achieving the above object, the apparatus for detecting and correcting CRC errors according to the present invention includes: a first gate for switching an input data; a buffer register for receiving the input data so as to output the input data r(x) in parallel; a syndrome register section including a plurality of syndrome registers for forming redundancies for the output data of the first gate; an OR gate for receiving data from the syndrome register section so as to carry out an OR-operation; a decoder for receiving an output of the OR gate so as to be enabled in accordance with its value, and for receiving an output of the syndrome register section so as to decode it before outputting it; a plurality of Ex-OR gates for receiving the outputs of the buffer register and the decoder so as to carry out Ex-OR arithmetic operations; and a latching section for receiving outputs of the Ex-OR gates so as to stabilize them.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

The present invention will be described in detail referring to the attached drawings.

Figure 1:
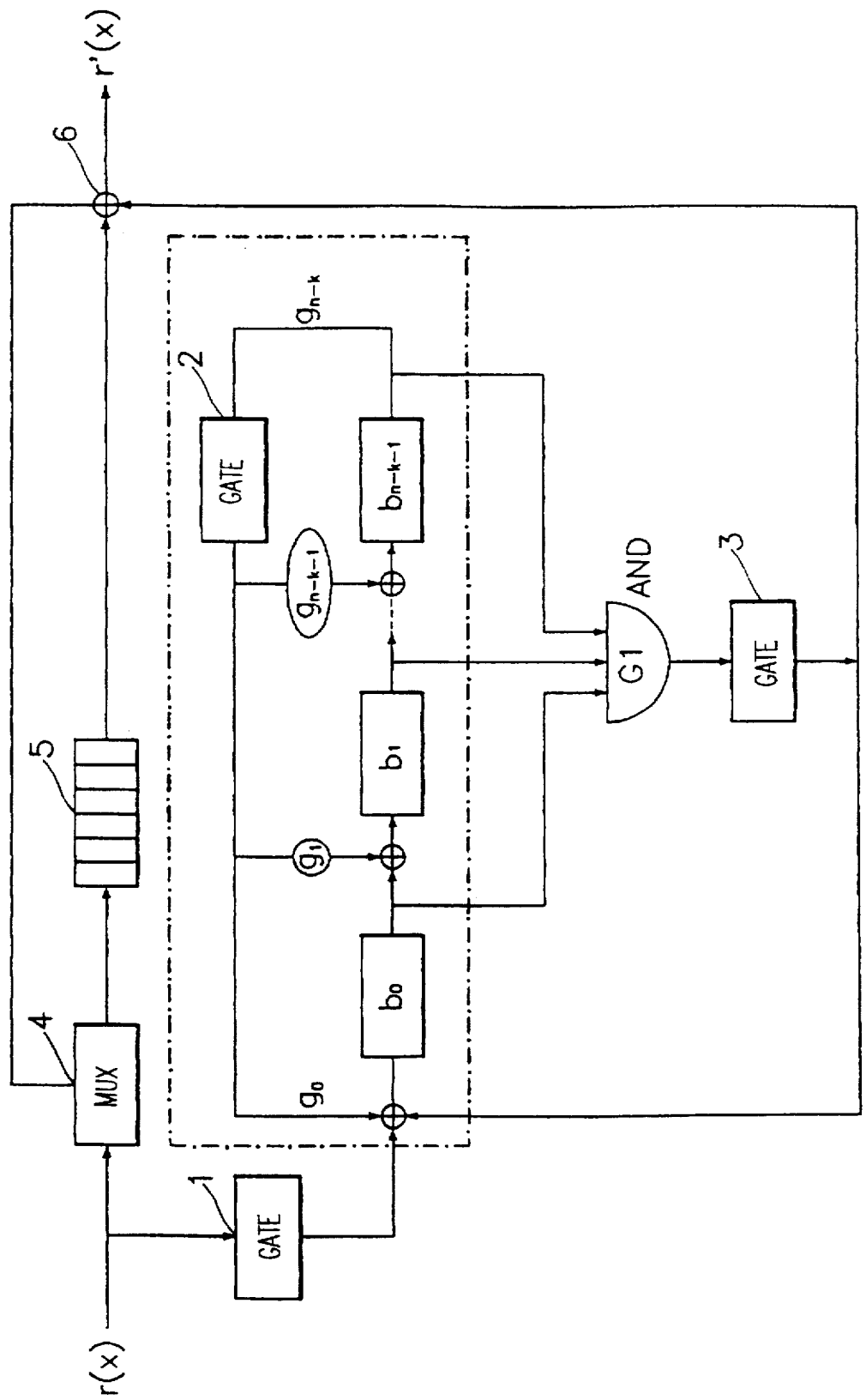
FIG. 1 illustrates the conventional CRC decoder.
Figure 2:
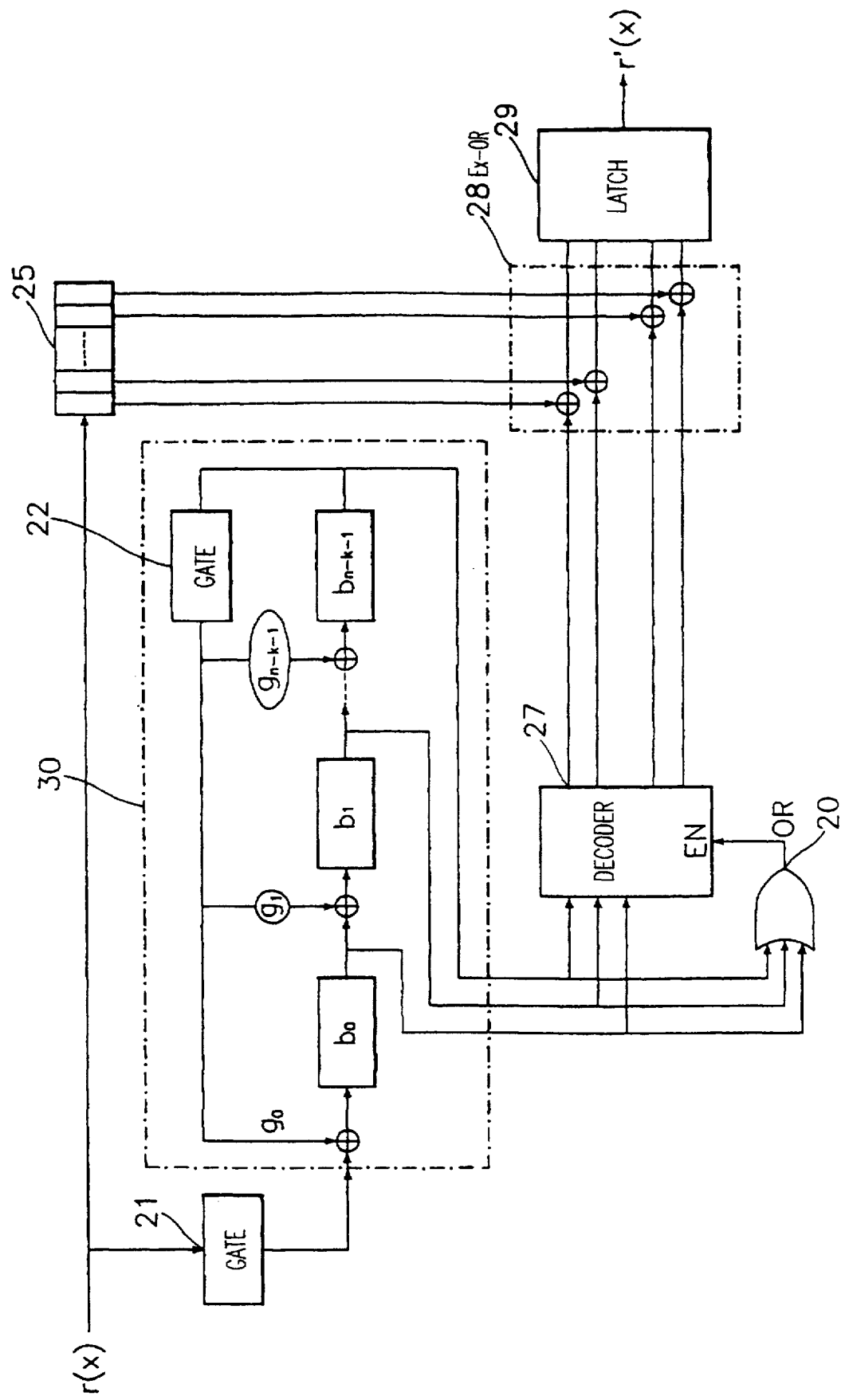
FIG. 2 is a block diagram showing the constitution of the apparatus for detecting and correcting CRC errors according to the present invention.

FIG. 2 is a block diagram showing the constitution of the apparatus for detecting and correcting CRC errors according to the present invention.

A first gate 21 switches input data r(x), and outputs them. A buffer register 25 receives the the input data r(x); to output the input data r(x) in parallel. A syndrome register section 30 includes a plurality of syndrome registers b0, b1, ... bn-k-1 for forming redundancies for the data r(x) of the first gate 21.

An OR gate 20 receives the output of the syndrome register section 30 so as to carry out OR-arithmetic operations. A decoder 27 receives the output of the OR gate so as to be enabled, and receives the outputs of the plurality of the syndrome registers B0, B1, ... Bn-k-1 of the syndrome register section 30 so as to decode them before outputting them.

An Ex-OR gate section 28 receives the outputs of the buffer register 25 and the decoder 27 so as to carry out Ex-OR arithmetic operations.

A latching section 29 receives the output of the Ex-OR gate section 28, and outputs the signals r'(x) in accordance with inputted clocks.

The apparatus of the present invention constituted as above will now be described as to its operation and effects.

The input data r(x) are supplied to the buffer register 25 and to the first gate 21. The buffer register 25 shifts the inputted data r(x) in a sequential manner, and store data of certain bits (e.g., 8 bits, 16 bits or the like). The syndrome register section 30 receives the data through the first gate 21, and receives n-k-bit data in a sequential manner to store them in such a manner that the most significant bits are stored in the rightmost syndrome register bn-k-1, and that the least significant bits are stored in the leftmost syndrome register b0. Gate 22 switch controls the data output from the most significant bit register $b_{n-k-1}$ which is fed back to the previous syndrome registers.

The respective syndromes which are outputted from the plurality of the syndrome registers b0, b1, . . . bn-k-1 are inputted into the decoder 27 and the OR gate 20. An enable terminal EN of the decoder 27 is connected to an output terminal of the OR gate 20, and therefore, if anyone of the plurality of the syndrome registers has a non-zero value, the decoder 27 is enabled.

If all the syndrome registers are 0, it is meant that an error has not been occurred, and therefore, they are disabled by the "0" output of the OR gate 20. Meanwhile, the contents of the buffer register 25 are outputted through the Ex-OR gate section 28 and the latching section 29.

In order to correctly connect the output of the decoder 29 to the buffer register 25, there is utilized a parity check matrix.

The parity check matrix H which is used in the embodiment of the present invention is expressed as follows:

$$H=[I_{n-k}\ P_{n-k,k}]$$

where In-k represents a (n-k)×(n-k) equality matrix, and Pn-k,k represents a matrix consisting of parameters composed of a parity check formula.

For example, in the case where a polynomial g(x) is expressed by $g(x)=1+x+x^3$, the parity check matrix H(n,k) =7,4 can be expressed as follows.

$$H = \begin{bmatrix} 1 & 0 & 0 & 1 & 0 & 1 & 1 \\ 0 & 1 & 0 & 1 & 1 & 1 & 0 \\ 0 & 0 & 1 & 0 & 1 & 1 & 1 \end{bmatrix}$$

It will be assumed that the column vectors (100)(010) . . . (101) of this parity check matrix H are indicated by V1, V2, . . . , Vn. Then when the column vectors V1, V2, . . . , Vn are inputted into the decoder, then as shown in FIG. 2, the least significant bits LSB (the uppermost bits) of the decoder 27 together with the least significant bits LSB (the leftmost bits) of the buffer register 25 are made to undergo Ex-OR-arithmetic operations. Meanwhile, the most significant bits MSB (the rightmost bits) of the decoder 27 together with the most significant bits MSB (the rightmost bits) of the buffer register 25 are made to undergo Ex-OR-arithmetic operations.

According to the present invention as described above, the conventional serial shift registers are replaced with parallel shift registers, so that the time consumed for the CRC checking can be shortened. Further, in detecting errors in the received data, the output of the OR gate has only to be checked in a simple manner.

What is claimed is:

1. An apparatus for detecting and correcting cyclic redundancy check (CRC) errors, comprising:

a first gate for switching an input data;

a buffer register for receiving the input data and outputting the input data in parallel;

a syndrome register section including a plurality of syndrome registers for forming redundancies for an output data of said first gate;

an OR gate for receiving data from said syndrome register section to produce an enable signal;

a decoder receiving said enable signal from said OR gate, said decoder for decoding said data from said syndrome register;

a plurality of exclusive-OR (Ex-OR) gates for receiving outputs of said buffer register and said decoder and performing Ex-OR arithmetic operations; and a latching section for latching outputs of said Ex-OR gates.

2. The apparatus as claimed in claim 1, wherein said syndrome register section comprises a plurality of syndrome registers.

3. The apparatus as claimed in claim 1, wherein if outputs of the plurality of said syndrome registers are all "0", then no error is detected and said OR gate disables said decoder.

4. The apparatus as claimed in claim 1, wherein said decoder and said latching section respectively have a same number of input terminals.

5. The apparatus as claimed in claim 1, wherein a state of said syndrome register section and the consequent output of said decoder are calculated from a mapping table based on a parity check matrix.

6. A cyclic redundancy check (CRC) circuit, comprising:

a buffer register for storing bits of a serial input data that may contain an error and outputting said serial input data as parallel input data;

a plurality of serially connected syndrome registers for creating redundant data from said serial input data;

a decoder for decoding an output from said plurality of serially connected syndrome registers;

an OR gate for enabling said decoder if any of said a plurality of serially connected syndrome registers are active; and exclusive OR means for performing an exclusive OR function on each bit of said parallel input data with an output of said decoder when said decoder is enabled, wherein a result of said exclusive OR function corrects errors in the serially input data.

7. A cyclic redundancy check (CRC) circuit as recited in claim 6 wherein said plurality of serially connected syndrome registers comprise a most significant bit register and a least significant bit register, wherein said least significant bit register receives as an input said serial input data exclusively ORed with an output of said most significant bit register and, wherein said most significant bit register receives as an input an output of a previous one of said plurality of serially connected syndrome registers exclusively ORed with said output of said most significant bit register.

8. A cyclic redundancy check (CRC) circuit as recited in claim 7 wherein said decoder decodes said output from said plurality of serially connected syndrome registers according to a parity check matrix.

9. A cyclic redundancy check (CRC) circuit as recited in claim 6 further comprising a latch circuit for latching an output of said exclusive OR means as a serial data stream.

* * * * *